Oct. 5, 1965 K. S. STULL, JR 3,210,668

GATED AMPLIFIER CIRCUITS

Filed March 3, 1960 3 Sheets-Sheet 1

WITNESSES

Leon J. Taza

John E. Healey, Jr.

INVENTOR

Keefer S. Stull, Jr

BY Maury I. Hull

ATTORNEY

GATED AMPLIFIER CIRCUITS

Filed March 3, 1960 3 Sheets-Sheet 2

Oct. 5, 1965 K. S. STULL, JR 3,210,668

GATED AMPLIFIER CIRCUITS

Filed March 3, 1960 3 Sheets-Sheet 3

United States Patent Office 3,210,668
Patented Oct. 5, 1965

3,210,668

GATED AMPLIFIER CIRCUITS

Keefer S. Stull, Jr., Baltimore, Md., assignor to Westinghouse Electric Corporation, East Pittsburgh, Pa., a corporation of Pennsylvania Filed Mar. 3, 1960, Ser. No. 12,542
6 Claims. (Cl. 328—101)

This invention relates to improvements in gating circuits, and more particularly to gated tuned amplifier circuits in which switching transients are substantially eliminated, and which may not require push-pull input and output circuits.

Prior art gating circuits are characterized by a number of limitations and disadvantages. In conventional gating circuits, the circuit parameters are chosen so that a gating voltage switches the tube grid bias between its normal operating point and a bias point beyond cutoff. Such an arrangement effectively switches the gain of the tube from normal to zero, but the resulting gated direct-current plate current which flows through the output tuned circuit generates a switching transient in the signal bandpass region of the amplifier. Prior art attempts to eliminate these transients by gating a push-pull stage necessitate accurately balanced or center-tapped input and output tuned circuits. In practice, at high frequencies of the order of 30 megacycles per second and higher, it is sometimes difficult or inconvenient to build perfectly balanced input and output tuned circuits, because to obtain good balance requires balancing capacitors, or else it is necessary to approach unity coupling between two halves of a balanced inductor. Such close coupling can best be obtained by a cross-connected bifilar winding which greatly increases the distributed capacitance of the inductor, and either arrangement decreases the gain bandwidth product of the gated stage.

These and other disadvantages of the prior art are overcome in some embodiments of the apparatus of the instant invention by employing a dual tube arrangement in which a normally conducting tube and a normally non-conducting tube both have their anode currents flow through the signal load impedance. When a gating pulse is applied the normally conducting tube is switched to non-conduction and the normally non-conducting tube is switched to conduction. The direct-current plate currents of the two tubes are equal during conduction, and at any time only one tube is conducting, therefore the current in the signal load is constant and no switching transient is produced in the output. The signal to be amplified is applied to only one of the two tubes and is accordingly gated on and off. Such a circuit does not require balanced input and output circuits.

Another difficulty frequently encountered in prior art gating circuits is that the gated amplifier stage will pass a signal even when the plate current is completely cut off. The signal leakage path is mainly through interelectrode and stray capacitance, but poor decoupling, ground currents, and stray inductive coupling can also contribute to signal leakage. The capacitive component of signal leak-through can be neutralized with simple circuits, but complete neutralization is very difficult to obtain with conventional circuits, and the best on-to-off gain ratios obtainable in conventional circuits may be of the order of 50 decibels at a signal frequency of 30 megacycles per second.

Also in prior art balanced gating circuits transients are produced not only by lack of perfect balance in the input and output signal circuits and between the tubes, but also the applied gating pulse is coupled directly into the signal circuit through the interelectrode capacitances of the tubes.

In another embodiment of the invention these two disadvantages of the prior art are overcome by using a balanced grounded-grid circuit which has inherently very low interelectrode coupling between the input and output circuits to minimize signal leak through during the "off" mode. The small leak-through that exists can be easily neutralized to give on-to-off gain ratios greater than 90 db. Similarly the gating pulse is well isolated from the output signal circuit so that gating transients produced by such coupling are greatly minimized.

The input impedance of a grounded-grid amplifier is very low and greatly loads its driving circuit. When the grounded-grid amplifier is gated "off" this load is removed and the gain of the driving stage would rise undesirably. This rise in gain is prevented by gating "on" another load when the grounded-grid stage is gated "off." Actually the impedance of the auxiliary load can be lower than the input impedance of the grounded-grid stage, thus decreasing the gain of the driving stage in the "off" mode and increasing the on-to-off gain ratio. The heavy loading of the signal input circuit of the gated stage also greatly damps out transients that would be produced in this circuit.

Two basic methods of obtaining the gated auxiliary load are presented. In one method the gating pulse applied to the grounded-grid stage also switches a pair of diodes in and out of conduction. The dynamic resistance of the diode during conduction provides the auxiliary load required. In the other method the gating pulse is applied to the grounded-grid tubes through a pair of cathode followers. The low dynamic output resistance of the cathode followers during conduction provides the required auxiliary load. Because of the high input impedance of a cathode follower the source impedance of the gating pulse can be much higher than when diodes are used.

Accordingly, a primary object of the instant invention is to provide a new and improved gating circuit.

Another object is to provide a new and improved gated amplifier circuit particularly suitable for frequencies of the order of 30 megacycles per second and above.

Another object is to provide a new and improved gated amplifier circuit in which transients are substantially eliminated in the output thereof.

Another object is to provide a new and improved gating circuit which performs like a balanced circuit but does not require balanced input and output circuits.

A further object is to provide a new and improved gating circuit in which circuit balance is easily obtained to reduce transients to a minimum and reduce to a minimum signal leakage while the circuit is in an ungated or "off" condition.

These and other objects will become more clearly apparent after a study of the following specification, when read in connection with the accompanying drawings, in which.

Figure 1:
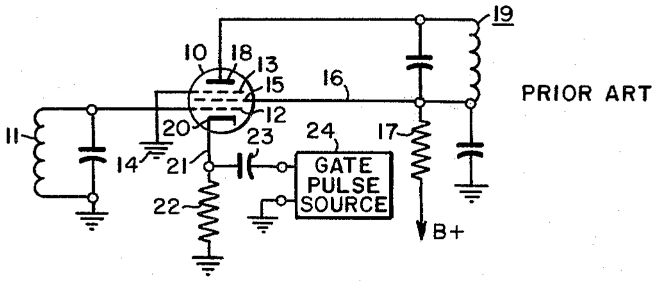
FIGURE 1 is a view of a gated amplifier according to the prior art.

Referring now to the drawings, in which like reference characters are used throughout to designate like parts, for a more detailed understanding of the invention, and in particular to FIGURE 1 thereof, there is shown at 10 a conventional electron discharge tube which may be of the pentode type, having an input signal developed across inductor 11 applied to the control grid 12 thereof. The suppressor grid 13 is connected to ground 14 while the screen grid 15 is connected by way of lead 16 and resistor 17 to the positive terminal of a suitable source of direct current potential, not shown, having the other negative terminal thereof connected to ground. Anode 18 is connected by way of tuned circuit 19 to lead 16 which is bypassed to ground as shown. The cathode 20 is connected by way of lead 21 and resistor 22 to ground 14; lead 21 is connected by way of capacitor 23 to a gate pulse source 24, which may be of conventional design, for providing a pulse of desired polarity for gating the circuit "on" and "off," by varying the tube bias between cut-off and operative conditions. In the operation of the circuit of FIGURE 1, which shows a conventional amplifier stage gated by a rectangular voltage waveform applied to the cathode 20 from the gate source 24, the parameters of the circuit must be chosen so that the gating voltage switches the tube between its normal operating point bias and a bias beyond cutoff, and this arrangement, as will be readily understood by those skilled in the art, switches the gain of the tube from normal to zero. The resulting gated direct current plate current which flows through the output tuned circuit 19 generates switching transients in a load coupled to the tuned circuit 19.

Figure 2:
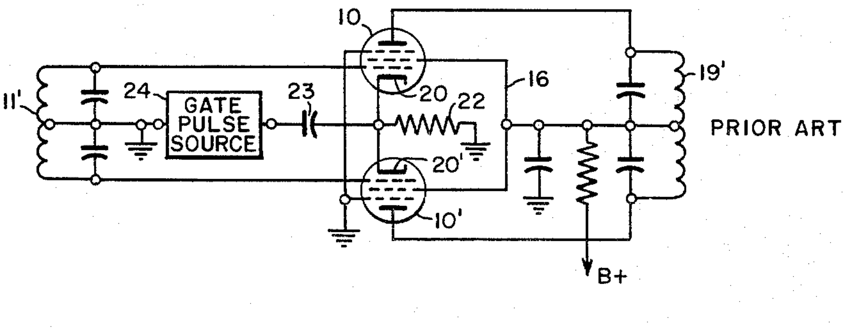
FIG. 2 is a view of an additional prior art gating circuit in which push-pull operation is employed, the prior art circuits being shown to facilitate an understanding of the instant invention.

Particular reference is made now to FIGURE 2, which shows a prior art circuit similar to that of FIGURE 1, but in which two tubes 10 and 10′ are shown connected for push-pull operation, and in which the gating pulse from gate source 24 is simultaneously applied to the cathodes 20 and 20′ of the two tubes by way of capacitor 23. Only by very careful balance of the input and output tuned circuits can some degree of cancellation of switching transient effects be obtained, since the plate currents of the two tubes flow in opposite directions in the balanced output circuit 19′. However, as previously stated, in practice at frequencies of the order of 30 megacycles per second and higher, it is difficult or inconvenient to build perfectly balanced input and output tuned circuits, and good balance requires balancing capacitors or a high coefficient of coupling between the halves of balanced inductors, thereby decreasing the gain of the stage.

Figure 3:
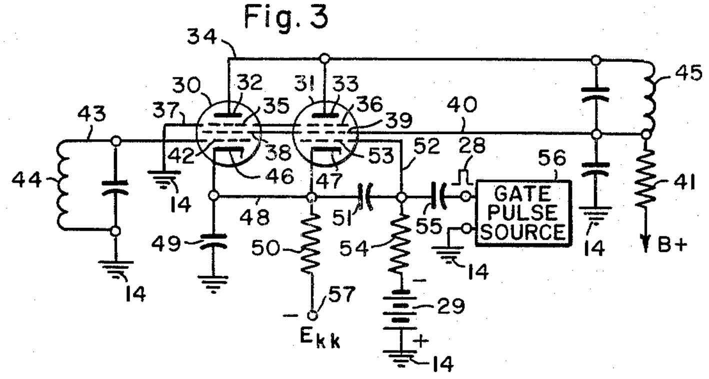
FIG. 3 is a view of the invention according to one embodiment thereof.

Particular reference should be made now to FIGURE 3 in which one embodiment of the instant invention is shown. Two tubes 30 and 31, which may be of the conventional pentode type, have their respective anodes 32 and 33 connected together by lead 34, their respective suppressor grids 35 and 36 connected together by lead 37 and thence to ground 14, their respective screen grids 38 and 39 connected together by way of lead 40 and thence by way of resistor 41 to the positive terminal of a suitable source of direct-current potential, not shown, having the other negative terminal thereof connected to ground 14. The control grid 42 of tube 30 is connected by way of lead 43 to receive an input from a tuned circuit 44. The aforementioned lead 34 is connected to an output tuned circuit 45 also operatively connected by way of the aforementioned resistor 41 to the source of direct current potential for energizing the anodes. The respective cathodes 46 and 47 of tubes 30 and 31 are connected together by lead 48 and thence by capacitor 49 to ground 14, lead 48 also being connected by way of resistor 50 to the negative terminal 57 of an additional source of direct current potential, not shown, having the positive terminal thereof connected to ground. The aforementioned lead 48 is connected by way of capacitor 51 and lead 52 to the control grid 53 of the aforementioned tube 31, lead 52 also being connected by way of resistor 54 and bias source 29 to ground 14. Lead 52 is also connected by way of capacitor 55 to a gate pulse source 56 of any convenient design.

In the operation of the circuit of FIGURE 3, the values of the voltage $E_{kk}$ at terminal 57 and the value of resistor 50 are chosen to be large enough to approximate a constant current source for the cathodes 46 and 47. The value of this current should equal the desired cathode current of one tube operated as a class-A amplifier. In the absence of any gating pulse from source 56, tube 31 is normally cut off by the bias from battery 29 while tube 30 is normally conductive. Since the signal is applied to tube 30, the signal is normally gated on. A positive gate pulse 28 applied to grid 53 through lead 52 will pull the cathode 47 positive, thus making cathode 46 positive and in effect applying a negative bias to grid 42 sufficient to cut off tube 30. In effect the gate pulse transfers the constant current from one tube to the other by cathode coupling, but the net direct current plate current through the output circuit 45 remains constant. While current is flowing through tube 30, it is controlled by the input signal on the control grid 42 thereof and an output signal is produced in an output load coupled to circuit 45. While current is flowing through tube 31, it is not controlled by the input signal and no signal output results. Therefore, the switching of the direct current between the two tubes 30 and 31 effectively gates the signal "on" and "off" but the direct current through the output circuit 45 remains substantially constant and does not produce a switching transient. Capacitor 49 presents a low impedance signal path from cathode 46 to ground 14 to prevent cathode degeneration or loss of signal gain. Any capacitance from the cathodes to ground tends to increase the switching time, therefore capacitor 49 should be no larger than necessary for a signal bypass. Capacitor 51 is provided to supply a portion of the gating pulse 28 to the cathodes to permit fast switching.

Figure 4:
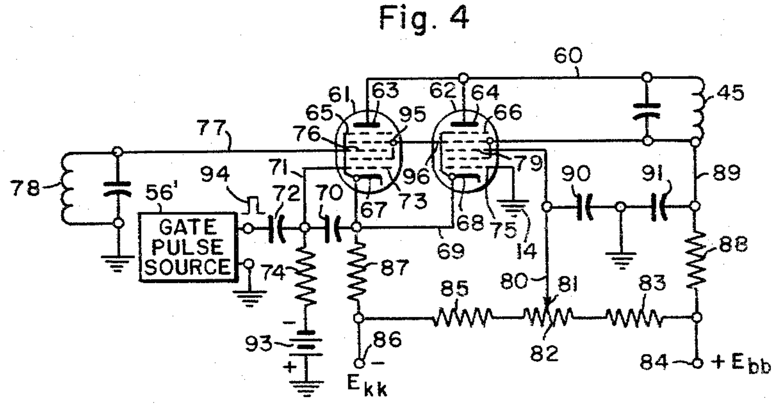
FIGS. 4, 5, 6 and 7 are views of the invention according to four additional embodiments thereof, the embodiment of FIG. 7 being the preferred form of the invention.

Particular reference is made now to the circuit of FIGURE 4 which represents a refinement and improvement of the circuit of FIGURE 3. In the circuit of FIGURE 4, a pair of dual control heptode tubes 61 and 62 are shown, having their anodes 63 and 64 connected together and to the tuned output circuit 45. Grids 65 and 66 are connected inside the tubes to their respective cathodes 67 and 68, the cathodes being connected together by way of lead 69 and thence connected by way of capacitor 70, lead 71 and capacitor 72 to receive the output pulse 94 of the gate pulse generator 56′. Lead 71 is connected to the control grid 73 of tube 61 and is also connected by way of resistor 74 and bias source 93 to ground 14. The control grid 75 of tube 62 is connected to ground 14. One additional grid 76 of tube 61 is connected by way of lead 77 to receive an input from tuned circuit 78; the corresponding grid 79 of tube 62 is connected by way of lead 80 to the arm 81 of a potentiometer 82. The potentiometer 82 has one end thereof connected by way of resistor 83 to the positive terminal 84 of a suitable source of direct current potential, not shown, having the other negative terminal thereof connected to ground 14. The other end of potentiometer 82 is connected by way of resistor 85 to the negative terminal 86 of an additional source of direct current potential, not shown, having the other positive terminal thereof connected to ground. Terminal 86 is connected by way of resistor 87 to the aforementioned lead 69. The aforementioned terminal 84 is connected by way of resistor 88 and lead 89 to corresponding additional grids 95 and 96 of the tubes 61 and 62, and lead 89 is also connected to the tuned circuit 45 to thereby supply energizing potential by way of lead 60 to the aforementioned anodes 63 and 64. Leads 80 and 89 are respectively bypassed to ground by capacitors 90 and 91.

In the operation of the circuit of FIGURE 4, the value of resistor 87 and the amplitude of the negative potential $E_{kk}$ are large to provide in effect a constant current source to lead 69. The positive gating voltage or pulse is applied to the first grid of tube 61 so that it switches the total space current in the two tubes by cathode coupling. It should be noted that in the circuit of FIG. 4 the signal is normally gated off, since the negative bias from battery 93 cuts off tube 61; a positive gate pulse 94 gates the signal "on." The signal applied to the third grid 76 of tube 61 has very little effect on the total space current but determines the distribution of this current between the anode 63 and screen grid 95. Therefore, no signal current flows in the cathode circuit so no by-pass capacitor is necessary there. The stray cathode-to-ground capacitance tends to increase the switching time of the cathodes, but this effect can be compensated for by the small capacitor 70 to give very fast switching without transients. The third grid 79 of tube 62 is supplied from potentiometer arm 81 with a voltage which is adjustable about zero, so that the direct current through the output circuit 45 can be made exactly the same with either tube conducting. The principal advantages of the circuit of FIGURE 4 over that of FIGURE 3 are: (1) the signal circuits are electrostatically shielded from the gating pulse by screen grids 95 and 96 thus reducing gating transients, (2) the anode currents from the two tubes can be made exactly equal thus reducing gating transients, and (3) the cathodes do not have to be by-passed, therefore capacitor 70 will be much smaller than 51 and there will be much less capacitive loading on gate source 56' than on 56 permitting faster switching.

Figure 5:
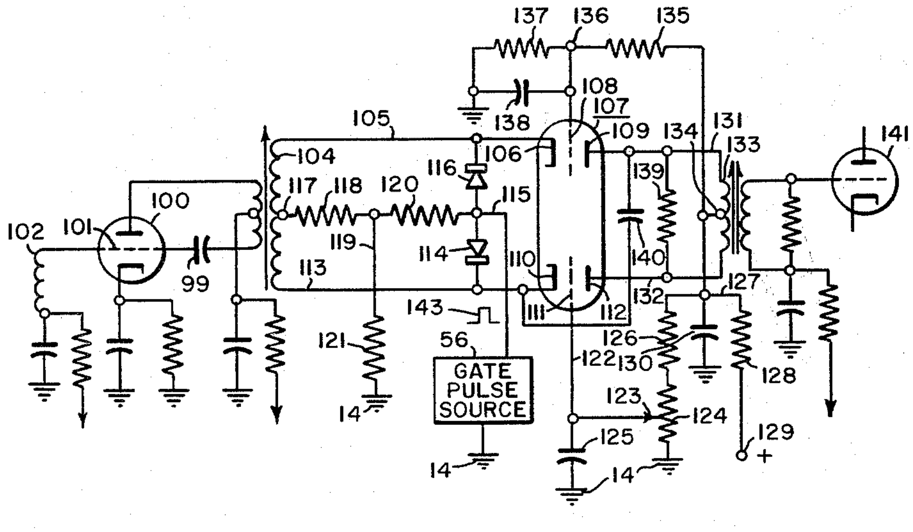

Particular reference is made now to FIGURE 5 in which another embodiment of the invention is shown. In FIGURE 5 a conventional triode circuit of tube 100 has the signal applied to the control grid 101 thereof has the signal applied to the control grid 101 thereof from the inductor 102. The output of tube 100 is inductively coupled to a center-tapped secondary 104 and the circuit arrangement provides capacitor 99 for neutralizing the effects of stray capacitance in the tube 100. The center-tapped secondary 104 has one end thereof connected by way of lead 105 to the cathode 106 of a dual triode generally designated 107, cathode 106 having control grid 108 and anode 109 associated therewith, the dual triode 107 also having the additional triode section including cathode 110, control grid 111 and anode 112. The other end of the aforementioned center-tapped secondary 104 is connected by way of lead 113 to the aforementioned cathode 110. Lead 113 is connected by way of rectifier 114, lead 115 and rectifier 116 to the aforementioned lead 105. The center tap 117 of the winding 104 is connected by way of resistor 118, lead 119 and resistor 120 to the aforementionel lead 115. Lead 115 is connected to the gate pulse source 56 to have the gating pulses applied thereto, the gating pulses being developed between lead 115 and ground 14. The aforementioned lead 119 is connected by way of resistor 121 to ground 14.

The aforementioned control grid 111 is connected by way of lead 122 to the arm 123 of a potentiometer 124, lead 122 being connected by way of capacitor 125 to ground 14. One end of potentiometer 124 is connected to ground 14 whereas the other end of potentiometer 124 is connected by way of resistor 126, lead 127 and resistor 128 to the positive terminal 129 of a suitable source of direct current potential, not shown, having the other negative terminal thereof connected to ground 14. Lead 127 is connected by way of capacitor 130 to ground 14.

The aforementioned anodes 109 and 112 are connected by leads 131 and 132 respectively to the ends of a center-tapped primary 133, the center tap 134 of which is connected to the aforementioned lead 127, which is also connected by way of resistor 135, lead 136 and resistor 137 to ground 14. Resistor 137 has capacitor 138 connected thereacross. The aforementioned lead 136 is connected to the aforementioned control grid 108. The aforementioned leads 131 and 132 have resistor 139 connected thereacross, and lead 131 is connected by way of capacitor 140 to the aforementioned lead 113 and cathode 110.

The secondary coupled to the aforementioned center-tapped primary 133 feeds its output to the control grid of the following tube 141 in a conventional manner.

The circuit of FIGURE 5 provides increased signal attenuation during the gated off condition, and also minimizes gating transients. The circuit of FIGURE 5 may give an attenuation during the "off" condition of at least 80 decibels, and transients are very small even for transition times of less than $\frac{5}{100}$ of a microsecond. In the operation of the circuit of FIG. 5, tubes 100 and 107 comprise a low noise cascade circuit, while tube 141 may be operated as a conventional amplifier. As previously stated, tube 100 is in effect a neutralized grounded-cathode circuit, and tube 107 is operated as a push-pull grid grounded amplifier with a positive gate pulse 143 applied to its cathodes to cut it off. The pulse also places the rectifiers 114 and 116, which may be crystal diodes or vacuum tube diodes, in conduction to place a low impedance across the secondary 104 and greatly decrease the amplitude of the signal applied to tube 107 during the off period. The small neutralizing capacitor 140 may balance the residual cathode-to-plate capacitance of the tube 107 to reduce the signal leak-through during the off period. The circuit of FIGURE 5 provides for a transient amplitude which is very low, because a balanced circuit is used, and the potentiometer 124 permits further balancing to compensate for any slight variation in the tube characteristics. An even higher degree of tube or circuit balance can be obtained by adjusting the plate voltage of one triode tube section relative to the other tube section by any convenient means, not shown, but which will occur to those skilled in the art. Generation of transients in the output transformer including center-tapped primary 133 due to direct pulse coupling from the cathode is greatly reduced by the shielding provided by the grounded grids. Generation of transients in the transformer having center-tapped secondary 104 is damped by the diode loading provided by diodes 114 and 116. In FIG. 5 in a typical application, tube 107 may be a type known in the trade as 6021, rectifiers 114 and 116 may be type IN66, and resistors 118, 120, and 121 may have values of 100 ohms, 1000 ohms, and 1000 ohms respectively. It will be noted that in FIG. 5 the pulse 143 is applied to the cathodes 110 and 106 through the diodes 114 and 116 and most of the pulse current flows into the cathode circuit through the diodes and biases them to a very low resistance point. Resistors 118 and 120 bias the diodes in the reverse directions during the "on" period so that they do not load the signal.

Figure 6:
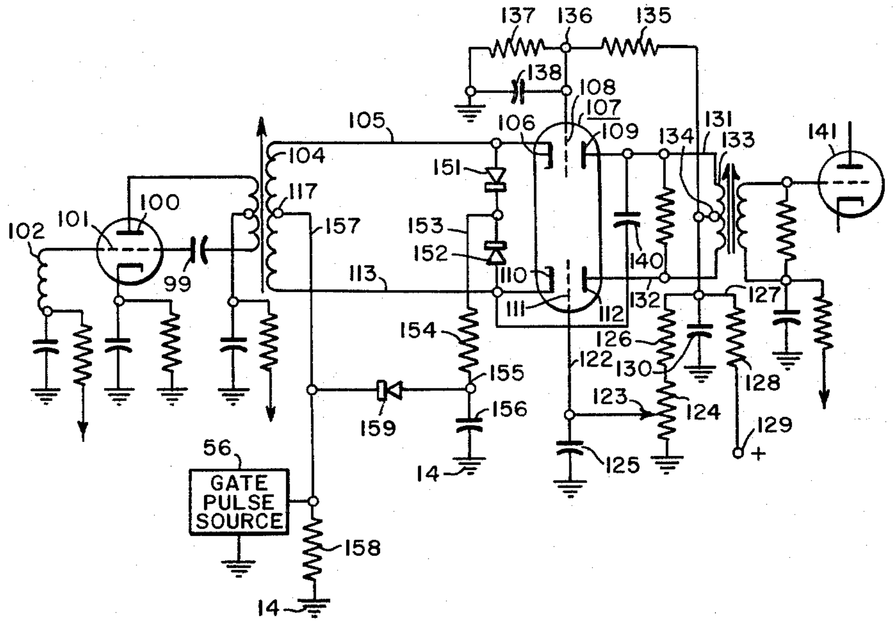

Particular reference is made now to FIG. 6, which is similar to FIGURE 5 in some particulars but in which the diodes 151 and 152 are in parallel with the cathodes 106 and 110, so that the pulse source not only has to supply current to the cathode resistor 158 but also additional current for the diodes 151 and 152 and their load resistor 154, resistor 154 having one end thereof connected to lead 153 which interconnects the cathodes of each of the rectifiers 151 and 152, the other end of resistor 154 being connected by way of lead 155 and capacitor 156 to ground 14. In FIGURE 6 it will be noted that the center tap 117 is connected by way of lead 157 and resistor 158 to ground 14, that the output of the gate pulse source 56 is applied to lead 157, and that lead 157 is connected by way of rectifier 159 to the aforementioned lead 155. Otherwise the circuit of FIG. 6 is similar to that of FIG. 5. In FIGURE 6, the network consisting of resistor 154, capacitor 156 and rectifier 159 biases the crystal rectifiers 151 and 152 in reverse directions during the "on" period or interval. The pulse current through rectifiers 151, 152 and resistor 154 tends to charge the capacitor 156 positively, but the voltage is limited to the forward drop across the rectifier 159 which discharges the capacitor 156 between gating pulses. This action maintains a constant bias, which may be of the order of approximately 0.5 volt, on the capacitor 156, which is sufficient to hold the rectifiers 151 and 152 biased off during the "signal on" condition, suitable rectifiers being chosen for use at 151 and 152.

Figure 7:
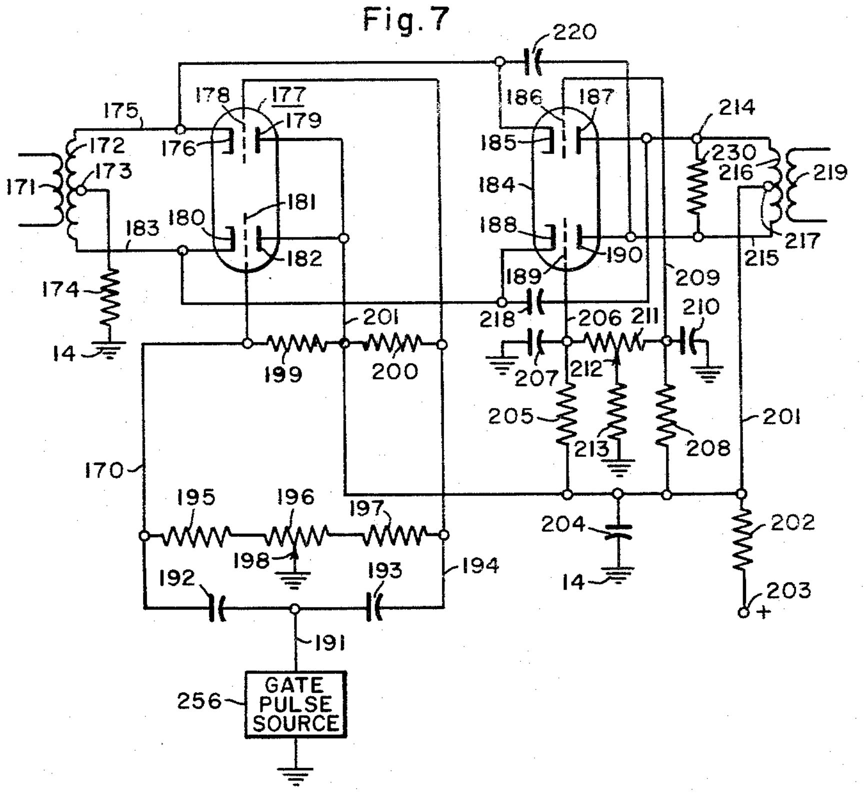

Particular reference is made now to FIG. 7 in which the preferred embodiment of the invention is shown in schematic form. In FIG. 7, an input signal applied to primary 171 induces a signal in center-tapped secondary 172, which has the center tap 173 thereof connected by way of resistor 174 to ground 14. One end of secondary 172 is connected by way of lead 175 to the cathode 176 of one section of a dual triode generally designated 177, cathode 176 having grid 178 and anode 179 associated therewith, the dual triode 177 also having another triode section including cathode 180, grid 181 and anode 182. The cathode 180 is connected by way of lead 183 to the other end of secondary 172.

A second dual triode generally designated 184 is provided having a first triode section with cathode 185, grid 186 and anode 187 and a second triode section with cathode 188, grid 189 and anode 190. Cathode 185 is connected to the aforementioned lead 175 whereas cathode 188 is connected to the aforementioned lead 183.

The gate pulse source 256 in FIG. 7 develops its output across the lead 191, lead 191 being connected by way of capacitor 192 and lead 170 to the aforementioned grid 181, and lead 191 being connected by way of capacitor 193 and lead 194 to the aforementioned control grid 178 of tube 177. Connected between leads 170 and 194 are a balancing network comprising in series resistor 195, potentiometer 196 and resistor 197. The arm 198 of potentiometer 196 is connected to ground 14. Also connected between the aforementioned leads 170 and 194 are a pair of series-connected resistors 199 and 200 interconnected by way of lead 201. Lead 201 is connected to both of the aforementioned anodes 179 and 182 of tube 177. Lead 201 is also connected by way of resistor 202 to the positive terminal 203 of a suitable source of direct current potential, not shown, having the other negative terminal thereof connected to ground 14. Lead 201 is connected by way of capacitor 204 to ground 14. The aforementioned lead 201 is also connected by way of resistor 205 and lead 206 to the aforementioned control grid 189 of tube 184, lead 206 being connected by way of capacitor 207 to ground 14. The aforementioned lead 201 is also connected by way of resistor 208 and lead 209 to the aforementioned grid 186 of tube 184, lead 209 being connected by way of capacitor 210 to ground 14. Leads 206 and 209 have connected therebetween the potentiometer 211 having the arm 212 thereof connected by way of resistor 213 to ground 14.

The aforementioned anodes 187 and 190 are connected by leads 214 and 215 respectively to the ends of a center-tapped primary 216 having the center tap 217 thereof connected to the aforementioned lead 201. Leads 214 and 215 have resistor 230 connected thereacross, and lead 214 is connected by way of capacitor 218 to the aforementioned lead 183, and lead 215 is connected by way of capacitor 220 to aforementioned lead 175. The aforementioned center-tapped primary 216 has a secondary 219 inductively coupled thereto for providing a signal to the following stage, or any other load.

In the operation of the circuit of FIGURE 7, preferably the tubes are selected for sufficiently low cutoff current with reasonable bias applied, and preferably both tubes are selected for reasonable balance between the two sections of the tube. It will be noted that a balance control is provided in the circuit for each tube to obtain near perfect circuit balance to minimize gating transients.

Tube 184 is a push-pull grounded-grid radio frequency or intermediate frequency amplifier with the aforementioned input transformer having center-tapped secondary 172 and the output transformer having center-tapped primary 216. The tube 177 is a cathode follower which is biased beyond cutoff for the "on" condition, but for the "off" condition the grids of tube 177 are made positive enough so that the current through tube 177 will be sufficiently large to cause a voltage drop in resistor 174 great enough to cut off tube 184. Tube 177 also has another function, in addition to cutting off tube 184. When tube 184 is on, the input signal sees a very low impedance looking into the cathodes 185 and 188 of tube 184. When tube 184 is off, the input impedance at that tube is very high and the gain of the preceding stage would normally rise, but to prevent the gain of this stage from rising tube 177 is connected in such a way that its low input impedance replaces that of tube 184, so that the gain of the preceding stage supplying a signal to winding 171 does not rise. Preferably, the value of resistor 174 is made low enough to allow sufficiently fast transition from off to on, but the value of this resistor should be carefully chosen to be no lower than necessary because low values of resistor 174 require higher currents through the tube 177. The resistance network consisting of resistors 199, 200, 195, 196, and 197 applies the proper biases to the grids 178 and 181 of tube 177 for the normal or quiescent condition. The arm 198 of potentiometer 196 as adjusted to allow the two triode sections of tube 177 to be balanced. The gating pulse as will be seen from observing the circuit, is applied in parallel to the tube grids of tube 177 through capacitors 192 and 193. A positive pulse is required to gate from a normally "on" condition to the "off" condition, or a negative pulse may be used to gate from normally "off" to "on."

The resistance network consisting of resistors 205, 211, 208 and 213 applies the proper biases to the grids 186 and 189 of tube 184. The potentiometer 211 is provided to allow the two triode sections of tube 184 to be balanced with respect to each other. Capacitors 207 and 210 are by-pass capacitors for the frequency of operation so that the grids of tube 184 are effectively grounded with respect to the signal. Capacitors 218 and 220 are preferably variable neutralizing capacitors to balance out the very small cathode-to-plate capacitance of the tube 184. Values of .1 to .3 micromicrofarad are typical for capacitors 218 and 220 for a typical tube type 6021, and one or both may be adjustable for "on" to "off" gain ratios greater than 60 decibels. Resistor 230 is a load for the transformer comprising windings 216 and 219 to give the desired bandwidth. Resistor 202 together with capacitor 204 are provided for decoupling from the plate supply.

Whereas positive pulses are described in connection with some embodiments for gating between "on" and "off" conditions, it will be understood that negative pulses could in at least some cases be employed, suitable rearrangement of biasing potentials being made. It will be also understood that any embodiment may be arranged to be normally on and gated "off," or vice versa, as desired.

Whereas the invention has been shown and described with respect to some embodiments thereof which gives satisfactory results, it should be understood that changes may be made and equivalents substituted without departing from the spirit and scope of the invention.

I claim as my invention:

1. A gated amplifier circuit comprising, in combination, first and second electron discharge tubes each having an anode, at least one grid and a cathode, an output load impedance common to said first and second electron discharge tubes, means for applying a signal to be gated on and off between a grid and cathode of at least one of said first and second electron discharge tubes, and gating circuit means including a gate pulse source for applying unidirectional gating pulses of one selected polarity simultaneously to said first and second electron discharge tubes to thereby simultaneously gate on one tube and gate off the other tube, said gating circuit means substantially eliminating transients in said common output load impedance resulting from changes in the anode currents of said first and second electron discharge tubes in response to the gating pulses and eliminating transients caused by high frequency components of the gating pulse which fall within the bandpass of the amplifier circuit.

2. A gated amplifier circuit comprising, in combination, signal input means including a transformer having a primary to which the signal is applied and having a center-tapped secondary, resistance means connecting the center tap of said secondary to a common circuit point, first and second cathode followers each including a cathode, grid and anode, one end of said center-tapped secondary being connected to the cathode of said first cathode follower, the other end of said center-tapped secondary being connected to the cathode of the second cathode follower, first and second electron discharge tubes each having a cathode, grid and anode, signal output means for the first and second electron discharge tubes, circuit means operatively connected to said common circuit point and to the grids of both the first and second electron discharge tubes for normally biasing said electron discharge tubes in operative conditions, the cathode of the first electron discharge tube being connected to the first named end of said center-tapped secondary and to the cathode of the first cathode follower, the cathode of the second electron discharge tube being connected to the other end of said center-tapped secondary and to the cathode of the second cathode follower whereby the cathode currents of the first and second electron discharge tubes flow through said resistance means and the cathode currents of the first and second cathode followers also flow through said resistance means, gate pulse generator means for generating gating pulses of predetermined polarity, and other circuit means connecting said gate pulse generator means to the grids of both the first and second cathode followers, said other circuit means including means for normally biasing said first and second cathode followers at operating points at which the cathode currents of the cathode followers flowing through said resistance means create a voltage drop insufficient to bias the first and second electron discharge tubes to cut-off thereby providing for the passage of the input signal through the first and second electron discharge tubes and thence to said signal output means, gating pulses of predetermined polarity applied to the grids of the first and second cathode followers causing said last-named grids to be made sufficiently positive whereby the current through each of the cathode followers increases resulting in an increase in the current in said resistance means and an increased voltage drop thereacross, said increased voltage drop across said resistance means biasing the first and second electron discharge tubes at cutoff while said pulse of predetermined polarity is applied to the first and second cathode followers thereby gating the signal off.

3. A gated amplifier circuit according to claim 2 including in addition means for balancing the gating pulses applied to said first and second cathode followers and means for balancing the static anode currents of said first and second electron discharge tubes.

4. A gated amplifier comprising push-pull input circuit means and push-pull output circuit means, a first and a second pair of signal translation valve means capable of being controlled for current-conducting and non-conducting conditions, hereinafter referred to, respectively, as "on" and "off" conditions, said first pair of valve means being connected with their current conducting paths in shunt across said push-pull input means and said second pair of valve means being connected with their current conducting paths in series with said push-pull input and output means, said second pair of valve means being normally in the "on" condition, circuit means including gating signal means for applying gating signals to said first and second pairs of valve means for simultaneously rendering said second pair of valve means "off" at the same time that said first pair of valve means is rendered "on," whereby the conducting impedance of said first pair of valve means is placed across said push-pull input means when said second pair of valve means are in the "on" condition, thus maintaining substantially constant impedance to the input circuit and eliminating transients in the output circuit means.

5. A gated amplifier circuit comprising push-pull input circuit means, push-pull output circuit means, means coupling said input and output circuit means including a first and a second pair of signal translation valve means capable of being controlled for current conducting and non-conducting conditions, hereinafter referred to, respectively, as "on" and "off" conditions, said first pair of valve means being connected with their current conducting paths in shunt across said push-pull input means and said second pair of valve means being connected with their current conducting paths connected in series with said input and said output means, said second pair of valve means being normally in the "on" condition and being connected for translating signals to push-pull circuit operation between said input and said output means, circuit means including gating signal means for applying gating signals of a selected unidirectional polarity simultaneously to the first of said pair of signal valve means, circuit means connecting said first pair of valve means to said second pair of valve means whereby when said first pair of valve means is gated "on" said second pair of valve means will be gated "off" and vice versa, whereby the simultaneous switching of said pairs of valve means between opposite states maintains a substantially constant input impedance across said circuit at the same time preventing transients from entering said output circuit as a result of said gating signals.

6. A gated amplifier comprising a center-tapped input transformer having its center tap connected to a common circuit point, a center-tapped output transformer having its center tap connected to said common circuit point, a first and a second pair of signal translation valve means, each pair being capable of being controlled for current conducting and non-conducting conditions, hereinafter referred to respectively as "on" and "off" conditions, said first pair of valve means being connected with their current conducting paths in shunt across the respective halves of said center-tapped transformer and said second pair of valve means being connected with their current-conducting paths in series in the signal path between said input and said output transformers, said second valve means being normally in the "on" condition, circuit means connected between said common circuit point and said first and second pair of signal translation valve means for normally holding said second pair of valve means in an "on" condition while said first pair of valve means is in the "off" condition, and circuit means including gating signal means for applying gating signals to said first pair of signal translation valve means for simultaneously putting said first pair of signal valve means in the "on" condition at the same time that said second pair of valve means is put in the "off" condition, said signals being passed from said input to said output through said second pair of valve means serving as amplifiers in push-pull relation while said gating signals are supplied to said first pair of said signal valve means in parallel, thereby causing the impedance between the input and output to remain substantially unaffected and causing transients resulting from the gating pulses to be in opposition in the output transformer to thereby eliminate the transients from the output circuit.

(References on following page)

References Cited by the Examiner

UNITED STATES PATENTS

| | | | |
|---|---|---|---|
| 2,556,693 | 6/51 | Houghton | 328—101 |
| 2,583,146 | 1/52 | Jacob | 328—101 |
| 2,597,038 | 5/52 | Scully | 328—101 |
| 2,695,956 | 11/54 | Mallinckrodt | 328—101 |

FOREIGN PATENTS

| | | |
|---|---|---|
| 1,176,654 | 4/59 | France. |
| 630,123 | 10/49 | Great Britain. |

ARTHUR GAUSS, *Primary Examiner.*

GEORGE N. WESTBY, ROY LAKE, *Examiners.*